United States Patent [19]

Hernandez et al.

[11] Patent Number: 4,706,162
[45] Date of Patent: Nov. 10, 1987

[54] MULTILAYER CAPACITOR ELEMENTS

[75] Inventors: Jorge M. Hernandez, Mesa; Aleta Gilderdale, Chandler, both of Ariz.

[73] Assignee: Rogers Corporation, Rogers, Conn.

[21] Appl. No.: 2,221

[22] Filed: Jan. 12, 1987

Related U.S. Application Data

[63] Continuation of Ser. No. 890,489, Jul. 25, 1986, Pat. No. 4,667,267, which is a continuation-in-part of Ser. No. 811,673, Dec. 20, 1985, Pat. No. 4,626,958, which is a continuation of Ser. No. 693,189, Jan. 22, 1985, abandoned.

[51] Int. Cl.$^4$ .......................... H01G 1/14; H01G 4/10
[52] U.S. Cl. .................................... 361/306; 361/321
[58] Field of Search ...................... 361/304-306, 361/308-310, 320-328, 330, 321; 29/25.42

[56] References Cited

U.S. PATENT DOCUMENTS

| | | | |
|---|---|---|---|
| 3,118,095 | 1/1964 | Baron et al. | 361/306 X |
| 3,394,386 | 7/1968 | Weller et al. | 361/321 X |
| 3,467,898 | 9/1969 | Ruffner | 361/321 X |
| 4,312,026 | 1/1982 | Iwaya et al. | 361/321 |
| 4,607,316 | 8/1986 | Wada et al. | 361/306 X |

Primary Examiner—Donald Griffin
Attorney, Agent, or Firm—Fishman & Dionne

[57] ABSTRACT

Several constructions of multilayer ceramic capacitor elements are presented which provide a low induction parallel-plate type capacitive structure.

14 Claims, 32 Drawing Figures

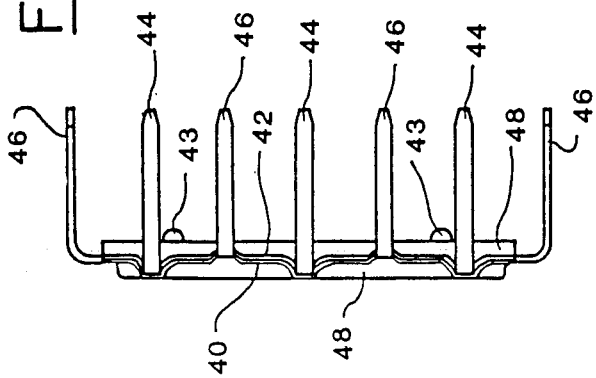
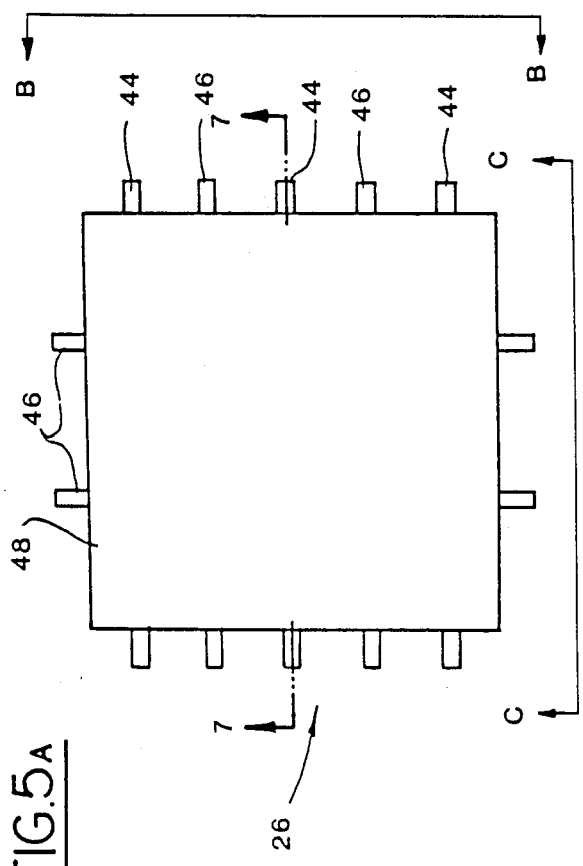
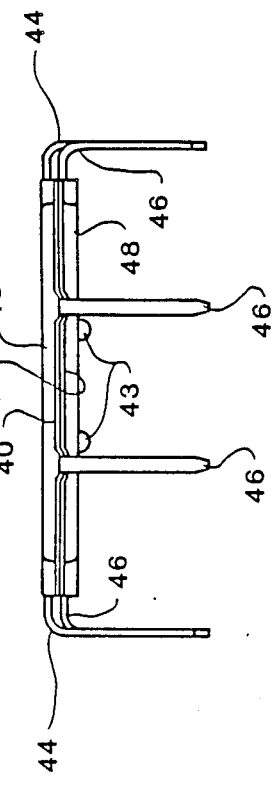

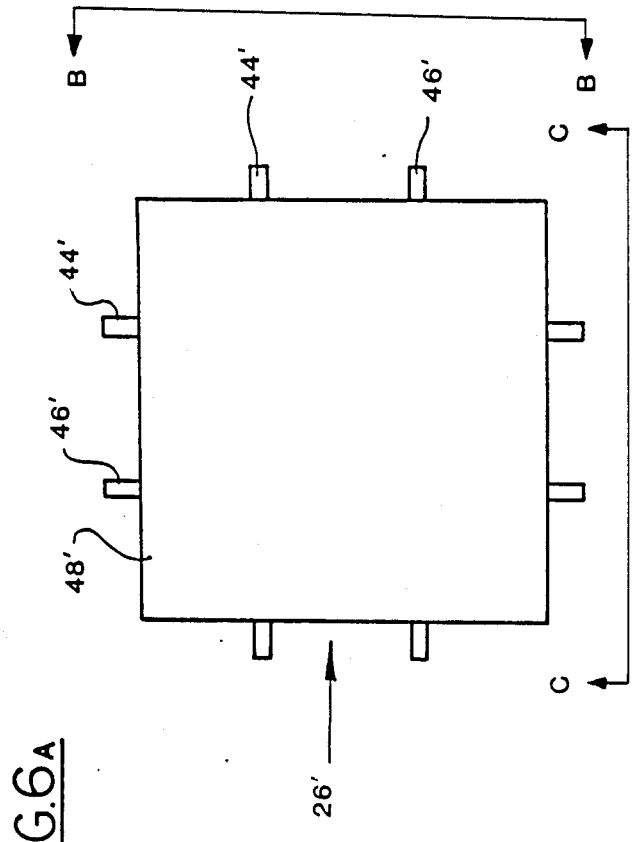

MULTILAYER CAPACITOR ELEMENTS

CROSS-REFERENCE TO RELATED APPLICATION

This application is a continuation of U.S. application Ser. No. 890,489 filed July 25, 1986, now U.S. Pat. No. 4,667,267 issued May 19, 1987, which, in turn, is a continuation-in-part of Ser. No. 811,673, filed Dec. 20, 1985, now U.S. Pat. No. 4,626,958, which, in turn, is a continuation of U.S. application Ser. No. 693,189 filed Jan. 22, 1985, now abandoned.

BACKGROUND OF THE INVENTION

This invention relates to the field of decoupling capacitors for integrated circuits. More particularly, this invention relates to novel and improved decoupling capacitors especially suitable for use in conjunction with Pin Grid Array (PGA) type integrated circuit packages.

It is well known in the field of microelectronics that high frequency operation, particularly the switching of integrated circuits, can result in transient energy being coupled into the power supply circuit. Generally, the prevention of the coupling of undesired high frequency noise or interference into the power supply for an integrated circuit is accomplished by connecting a decoupling capacitor between the power and ground leads of the IC. One connection scheme utilizes a capacitor which is mounted on a multilayer printed circuit board, outside the integrated circuit with plated through holes used to connect the capacitor to the internal power and ground planes, which in turn make contact with the power supply connection leads of the integrated circuit. A less preferred method (in terms of higher inductance) is to interconnect the decoupling capacitor and integrated circuit power and ground leads via traces on either a multilayer or double sided printed circuit board.

The above two decoupling techniques suffer from several deficiencies. The most serious of these deficiencies resides in the fact that the circuits, including the capacitors, become highly inductive at high frequencies as a consequence of the shape and length of the leads and interconnection traces between the discrete capacitor and the integrated circuit which it decouples. In fact, the inductance of the leads and printed circuit board traces may be sufficiently high to nullify the high frequency effect of the capacitor in the circuit. A second serious deficiency resides in the spatial inefficiency incident to employing a capacitor adjacent to the integrated circuit. The space requirements i.e., real estate, of the decoupling capacitor and the interconnection traces on the printed circuit board adversely affect the optimum component packaging density which can be achieved on the board.

In an effort to overcome the above-discussed deficiencies associated with the use of decoupling capacitors mounted on a printed circuit board, a decoupling capacitor which is adapted to be mounted underneath a conventional dual-in-line circuit has been proposed. U.S. Pat. No. 4,502,101 (which is assigned to the assignee hereof, and the entire contents of which are incorporated herein by reference) discloses a decoupling capacitor for an integrated circuit package. The decoupling capacitor of that prior patent is a thin rectangular chip of ceramic material which is metallized on opposite sides and has two electrically active leads from the metallized coatings on opposite sides of the chip at two points adjacent a pair of diagonally opposed corners of the rectangularly shaped ceramic chip. The capacitor may also contain two or more electrically inactive dummy leads. The two active (and dummy) leads are bent downwardly, and the decoupling capacitor assembly is encapsultated in a film of nonconductive material. In accordance with the teachings of that prior patent, the decoupling capacitor is dimensioned so as to be received in the space between the two rows of leads extending from a conventional dual-in-line integrated circuit. The two electrically active leads from the decoupling capacitor are plugged into a printed circuit board, with these leads from the capacitor being inserted into the printed circuit through holes to which the ground power supply conductors are connected. The associated integrated circuit or other electronic component is then positioned over the capacitor and inserted into the board such that the power supply leads of the integrated circuit or other component will be positioned in the same through holes of the printed circuit board in which the two electrically active capacitor leads have been inserted.

While suitable for its intended purposes, the decoupling capacitor described in U.S. Pat. No. 4,502,101 is not particularly adapted to be used in conjunction with Pin Grid Array (PGA) type integrated circuit packages. PGA packaging is becoming a commonly used IC packaging technology. As with conventional dual-in-line packages, PGA packages require similar decoupling across the power and ground leads. However, decoupling capacitors of the type disclosed in the prior patent application have a structure and configuration which preclude their usage in conjunction with the distinctive configuration of well known PGA packages.

SUMMARY OF THE INVENTION

The above-discussed deficiencies and drawbacks of prior art decoupling capacitors are overcome or alleviated by the novel decoupling capacitor of the present invention. In accordance with the present invention, a flat decoupling capacitor adapted for mounting directly under a Pin Grid Array package is provided which will result in a lower decoupling loop, thus providing a more effective decoupling scheme. The capacitor of the present invention also contributes to a savings in board space, i.e., takes up less "real estate" on the printed circuit board, by resting entirely under the PGA package.

A decoupling capacitor for use in conjunction with PGA packages in accordance with the present invention comprises a dielectric material, sandwiched between a pair of conductors. A plurality of leads are provided along the periphery of each conductor. These leads extend outwardly a short distance generally in the plane of the metal conductors to which they are attached and are then bent downwardly so as to extend in a direction which is perpendicular to the planes of the conductors. The entire assembly, with the exception of the plural transversely extending lead portions, may then be encapsulated within a suitable nonconductive material.

In an effort to achieve higher capacitance values and increased temperature stability, several embodiments of the present invention are described which utilize one or more multilayer capacitors sandwiched between the pair of conductors rather than a single layer of dielectric material as discussed above. Several types of multilayer ceramic capacitor elements are disclosed which provide a low induction parallel-plate type capacitive structure.

The decoupling capacitor assembly of the present invention is specifically sized and configured so as to be received in the space directly below the integrated circuit chip and between the downwardly extending pins of a PGA package. It is well known that PGA packages have many different types of pin configurations. Accordingly, the present invention has flexible lead locations and multiple pins from each voltage level of the PGA so as to be tailored to a particular PGA package.

The above-discussed and other advantages of the present invention will be apparent to and understood by those skilled in the art from the following detailed description and drawings.

BRIEF DESCRIPTION OF THE DRAWINGS

Referring now to the drawings, wherein like elements are numbered alike in the several Figures:

FIG. 5A is a plan view of a decoupling capacitor for use in conjunction with a Pin Grid Array package in accordance with the present invention;

FIG. 5B is a side elevation view along the line B—B of FIG. 5A.

FIG. 5C is a side elevation view along the line C—C of FIG. 5A.

FIG. 6A is a plan view, similar to FIG. 5A, of another embodiment of a decoupling capacitor in accordance with the present invention;

FIG. 6B is a side elevation view along the line B—B of FIG. 6A.

FIG. 6C is a side elevation view along the line C—C of FIG. 6A.

DESCRIPTION OF THE PREFERRED EMBODIMENT

Figure 1:
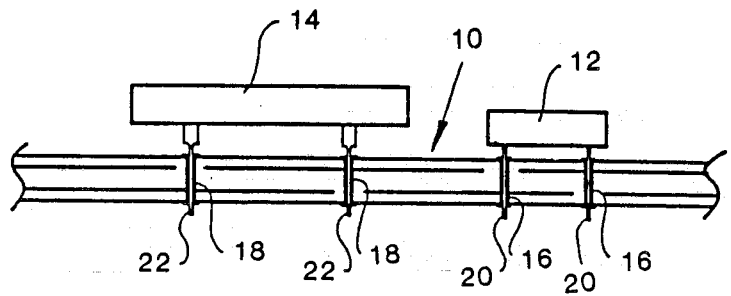
FIG. 1 is a side view of a Pin Grid Array package connected to a multilayer ceramic capacitor via plated throughholes and internal planes in accordance with the prior art.
Figure 2:
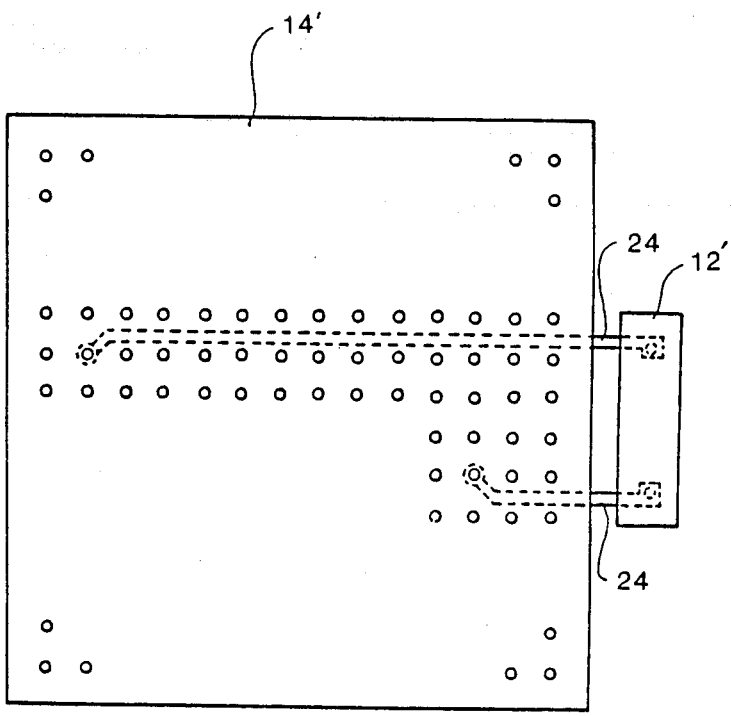
FIG. 2 is a plan view of a Pin Grid Array package connected to a multilayer ceramic capacitor via printed circuit traces in accordance with the prior art.

Referring first to prior art FIG. 1, a multilayer printed circuit board 10 is shown having a multilayer ceramic capacitor 12 and a Pin Grid Array (PGA) package 14 mounted thereon. Capacitor 12 is mounted outside PGA package 14 and plated through holes 16 and 18 are used to connect the capacitor leads 20 to the power and ground leads 22 of the PGA package 14. Prior art FIG. 2 shows a less effective decoupling scheme wherein printed circuit traces 24 are used to connect power and ground leads of the PGA package 14' with the decoupling capacitor 12'.

As discussed earlier, the prior art decoupling schemes of FIGS. 1 and 2 both suffer from serious deficiencies and drawbacks including high inductance in the leads and printed circuit board traces (especially in the FIG. 2 assembly) as well as inefficient use of board real estate which adversely affects component packaging density.

Figure 3:
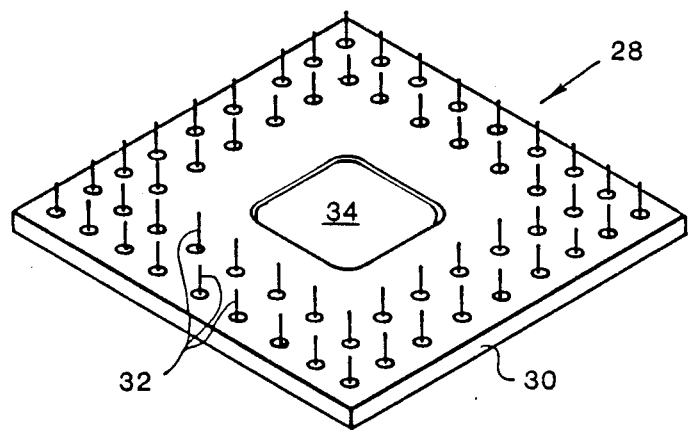
FIG. 3 is a perspective view of pin Grid Array package.
Figure 4:
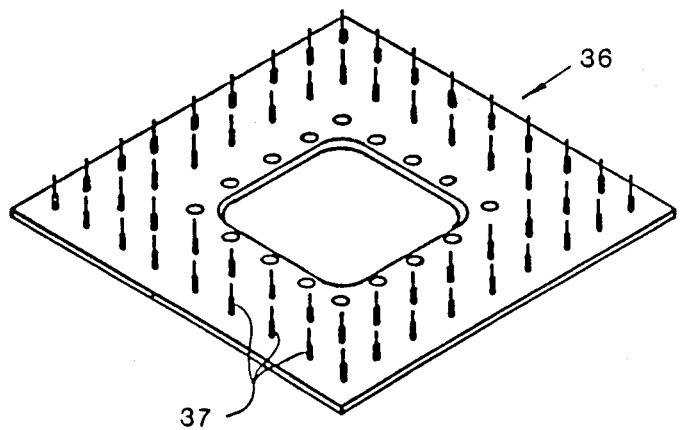
FIG. 4 is a plan view of a pin Grid Array socket.
Figure 7:
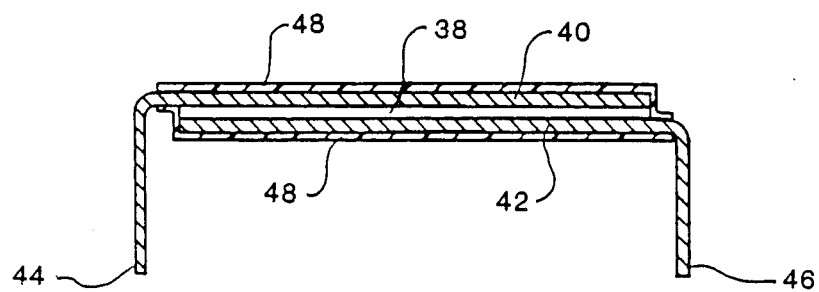
FIG. 7 is a cross-sectional elevation view along the line 7—7 of FIG. 5A.

These important problems are overcome by the decoupling capacitor of the present invention which is dimensioned and configured specifically to be used in conjunction with Pin Grid Array packages. Referring first to FIGS. 3 and 4, a typical PGA package is shown generally at 28. Pin Grid Array package such as that shown in FIGS. 3 and 4 are well known to those skilled in the art and comprise a square or rectangular base portion 30 having a plurality of pins 32 in an array or pattern extending therefrom. The pins may be of several types including signal pins, power and ground pins and alignment pins. Generally, the power and ground pins 32 of PGA package 28 are located about the inner periphery of the pin array (i.e., the inner rings of pins) and surround the center area 34. The center of the PGA package has no pins extending therefrom and is defined as the chip cavity area 34. Chip cavity area 34 receives an integrated circuit chip (not shown) to complete the PGA package. It is well known that the pin configuration and overall sizing of PGA packages may differ significantly from one part to the next depending upon the particular electronic requirements. It will be appreciated then, that while a PGA package having two concentric rows of pins is shown in FIG. 3, a PGA package may have (and usually does have) more concentric rows of pins.

The PGA package 28 of FIG. 3 may be mounted (i.e., soldered) either directly on a printed circuit board or may be preliminary mounted in a socket 36 (FIG. 4) prior to circuit board mounting. Socket 36 includes a plurality of pin sockets 37 which correspond to pins 32 and are adapted for receiving pins 32 therein.

It will be appreciated that the decoupling capacitor of the present invention is dimensioned and configured to be mounted under a PGA package (such as the one shown in FIG. 3) in the chip cavity area either under a socket or directly under a soldered package as will be discussed in more detail below with reference to FIGS. 9A and 9B.

Turning now to FIGS. 5A-5C and 7, a decoupling capacitor in accordance with the present invention is shown generally at 26. Decoupling capacitor 26 is comprised of a dielectric material or dielectric chip 38 (see FIG. 7) sandwiched between a pair of metal conductors 40 and 42. Each conductor 40, 42 has a plurality of leads 44 and 46 which are connected thereto and extend outwardly therefrom. The leads extend outwardly a short distance and then are bent downwardly so as to extend in a direction which is perpendicular to the planes of the conductors. The entire assembly, with the exception of the plural transversely extending lead portions are then encapsulated within a suitable nonconductive material 48. The encapsulation may be laminated insulation, a molded process or any other applicable method. The conductors 40, 42 may vary in thickness and in alloy content. The dielectric 38 may be comprised of any suitable dielectric material, preferably ceramic. Preferably, a pair of stand offs 43 are formed in encapsulation 48 to permit cleaning between the decoupling capacitor and circuit board.

The decoupling capacitor 26 of FIGS. 5A-5C include a total of 14 leads 44, 46, six (6) leads 44 being connected to one conductor 40 (voltage conductor), and eight (8) leads 46 being connected to the other conductor 42 (ground conductor). However, it will be appreciated that FIGS. 5A-5C describe only one particular lead configuration which is suitable for one (or more) particular Pin Grid Array package and its unique power pin configuration. As mentioned earlier, the dimensions and pin configurations of PGA packages can differ significantly from package to package. Accordingly, an important feature of the decoupling capacitor of the present invention is that it may be easily tailored to be used in conjunction with any PGA package. For example, in FIGS. 6A-6C, an alternative embodiment of a decoupling capacitor is shown at 26'. Capacitor 26' has the same parallel plate capacitor structure of a dielectric material sandwiched between two conductors as does capacitor 26. However, unlike FIGS. 5A-5C, the decoupling capacitor 26' of FIGS. 6A-6C includes a total of 8 leads 44' and 46', four (4) leads being connected to each conductor. Also, the outer dimensions of capacitor 26' may differ from the outer dimension of capacitor 26 depending upon the dimensions of the PGA package which is being used in conjunction therewith.

Figure 8A:
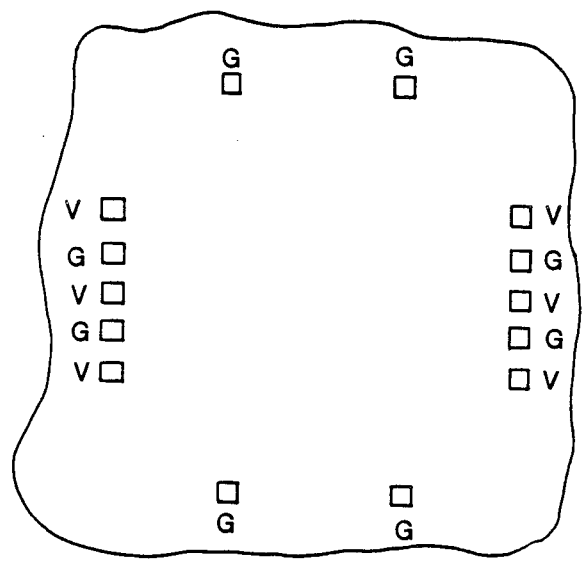
FIG. 8A is a pin designation of the inside pins of the Pin Grid Array package similar to the Pin Grid Array package of FIG. 3.
Figure 8B:
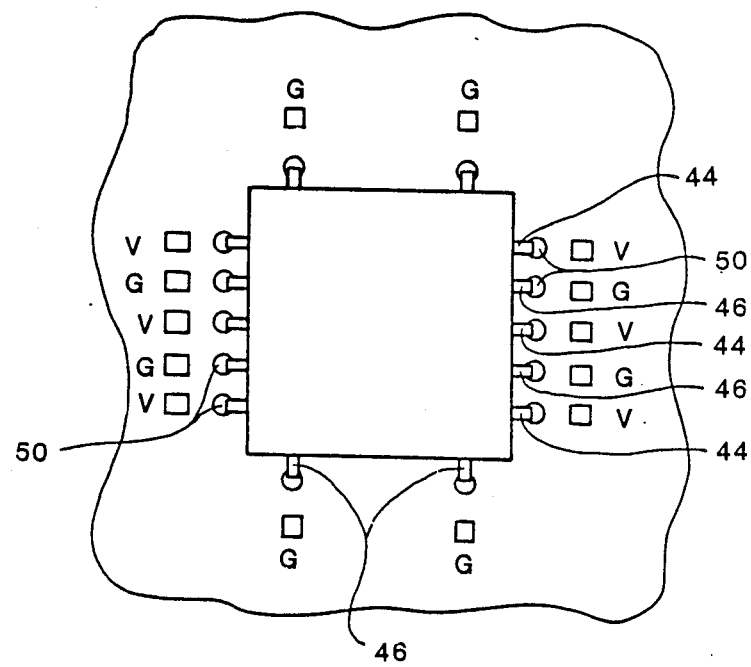
FIG. 8B is a pin designation of the decoupling capacitor of FIG. 5A connected to the inner perimeter of pins of the Pin Grid Array package of FIG. 3A.

As mentioned, the lead configuration of the decoupling capacitor of the present invention will be adapted to suit the particular needs of a selected PGA package power pin configuration. In FIG. 8A, a pin designation of the power pin configuration of a PGA package for use with the decoupling capacitor 26 of FIGS. 5A-5C is shown. FIG. 8A is thus representative of the pin configuration along the inner perimeter of pins of a PGA package such as the one described in FIG. 3. Each box in FIG. 8A represents a pin while the symbol "G" or "V" indicates whether the pin is power (voltage) or ground. Referring now to FIG. 8B, a decoupling capacitor 26 of FIGS. 5A-5C has now schematically been provided to the printed circuit board via additional holes 50. Each lead 44, 46 from capacitor 26 is matched with a corresponding voltage or ground pin from the PGA package to provide decoupling thereto. It should be understood that eight (8) leads 46 from capacitor 26 are connected to a ground conductor while the other six (6) leads 44 are connected to the voltage conductor in the capacitor.

Figure 9B:
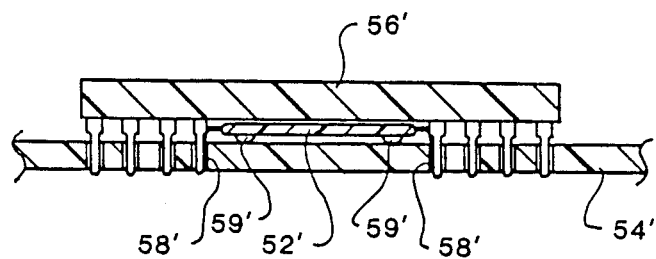
FIG. 9B is a cross-sectional elevation view, similar to FIG. 9A, of an alternative method of mounting the decoupling capacitor of the present invention.
Figure 9A:
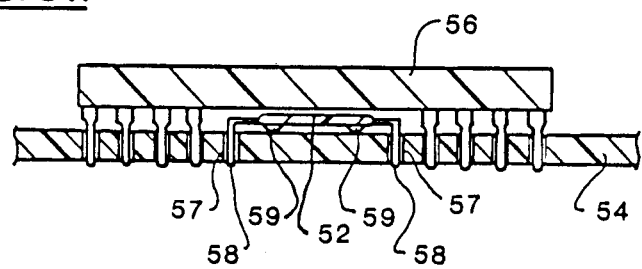
FIG. 9A is a cross-sectional elevation view of the decoupling capacitor of the present invention mounted underneath a Pin Grid Array package on a circuit board.

Referring now to FIG. 9A, the decoupling capacitor 52 of the present invention is shown mounted on a printed circuit board 54 underneath a PGA package 56. PGA package 56 is similar to PGA package 28 of FIG. 3, however, the PGA package 28 of FIG. 3 has been flipped over so that the pins extend downwardly through the printed circuit board 54. As discussed, enough space in the chip cavity area of the PGA package remains for the decoupling capacitor 52 of the present invention to be placed thereunder. In FIG. 9A, separate holes 57 have been provided in the circuit board 54 for receiving leads 58 therein. It will be appreciated that the leads of capacitor 52 and pins of PGA package 56 are connected either by plated through holes in a multilayer circuit board or by relatively short traces. As mentioned, the present invention is preferably provided with standoffs 59 which permit cleaning between the circuit board 54 and decoupling capacitor 52.

Turning now to FIG. 9B, an alternative method of mounting the decoupling capacitor of the present invention is shown. In FIG. 9B, the leads of capacitor 52' and pins of PGA package 56' share a circuit board hole. This method of mounting may be preferable to that shown in FIG. 9A as no additional holes need be provided to the printed circuit board 54'.

Figure 10A:
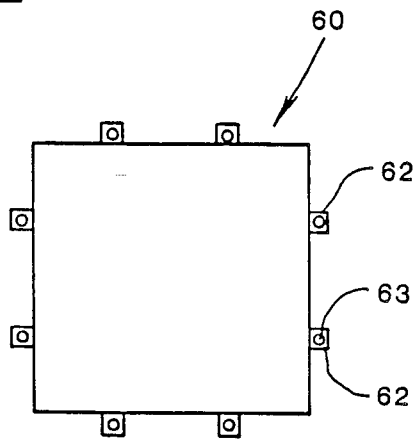
FIG. 10A is a plan view of another embodiment of a decoupling capacitor in accordance with the present invention.
Figure 10B:
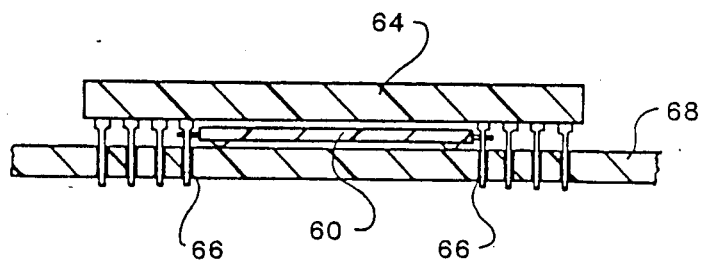
FIG. 10B is a cross-sectional elevation view of the decoupling capacitor of FIG. 10A mounted underneath a Pin Grid Array package on a circuit board.

An alternative lead configuration to that discussed heretofore is shown in the decoupling capacitor 60 of FIGS. 10A and 10B. Decoupling capacitor 60 has the same structure as those described earlier except that leads 62 are formed as extended tabs, each tab having an opening 63 therethrough for receiving the pin 66 of a PGA package 64. Decoupling capacitor 60 may thus be mounted on pins 66 of PGA package 64 prior to installation on printed circuit board 68 which may ease assembly and permit the use of automatic insertion equipment. The decoupling capacitor for use in conjunction with Pin Grid Array packages of the present invention has many features and advantages not found in the prior art. For example, by mounting a flat decoupling capacitor directly under a PGA package, the result will be a lower inductance decoupling loop, thus providing a more effective decoupling scheme. This alleviates many of the problems associated with the high inductance of the prior art decoupling schemes of FIGS. 1 and 2.

The present invention also permits a reduction in the amount of circuit board "real estate" occupied by the prior art decoupling devices of FIGS. 1 and 2. The need to save circuit board space to permit higher component mounting density is presently an important concern to those skilled in the art of electronic circuit design. Accordingly, the present invention addresses this problem by employing the novel mounting of decoupling capacitors underneath PGA packages.

While well suited for its intended purposes, the decoupling capacitor for PGA packages as shown in FIGS. 5A–C, 6A–C and 7 which utilize a single layer capacitive element sandwiched between two parallel plates does suffer from certain drawbacks. For example, the use of a single layer capacitive element severly limits the total capacitance of the decoupling device. Also, when attempting to achieve higher capacitance values, the temperature stability of the decoupling capacitor is adversely affected as those dielectric materials which provide higher capacitance are typically unstable as temperature increases. It will be appreciated that those dielectric materials which are stable at higher temperatures do not provide a high capacitance needed for decoupling purposes.

An advantage of the decoupling capacitors of FIGS. 5A–C, 6A–C and 7 is the parallel plate type construction. The use of "parallel plate" constructions inherently have the lowest inductive effects. As previously mentioned, inductive effects have a severly detrimental effect on the high frequency performance of a decoupling device.

The above described deficiencies of the single layer capacitors are overcome with the decoupling capacitors of FIGS. 17–23 which incorporate at least one multilayer capacitor element therein for increased capacitance and temperature stability. Significantly, the multilayer capacitor devices of FIGS. 17–23 preferably retain the parallel plate-type construction of the single layer capacitors thereby insuring a low inductance.

While many different constructions for multilayer capacitive elements (including both parallel plate and non-parallel plate constructions) may be utilized in conjunction with the present invention, several preferred configurations are shown in FIGS. 11–16. In all of these preferred constructions, the multilayer capacitive element is a multilayer ceramic capacitor with externally accessible parallel plane electrodes (in contrast to conventional multilayer ceramic capacitors having external electrodes along the respective ends of the ceramic body).

Figure 11:
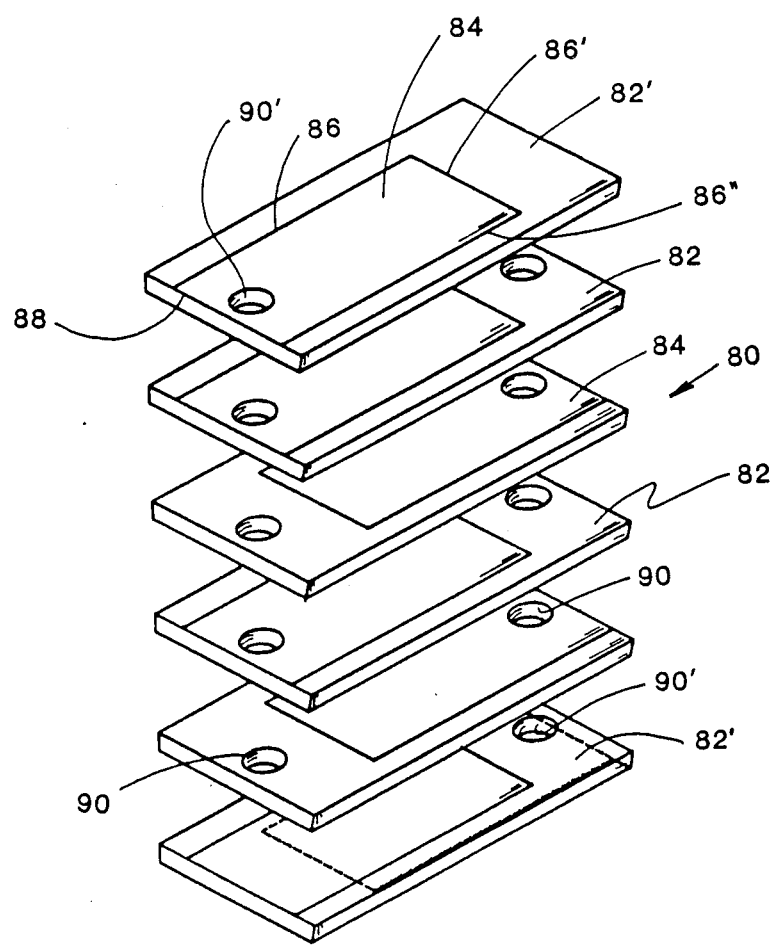
FIG. 11 is an exploded perspective view of a multilayer capacitor (MLC) chip in accordance with a first embodiment of the present invention.
Figure 12:
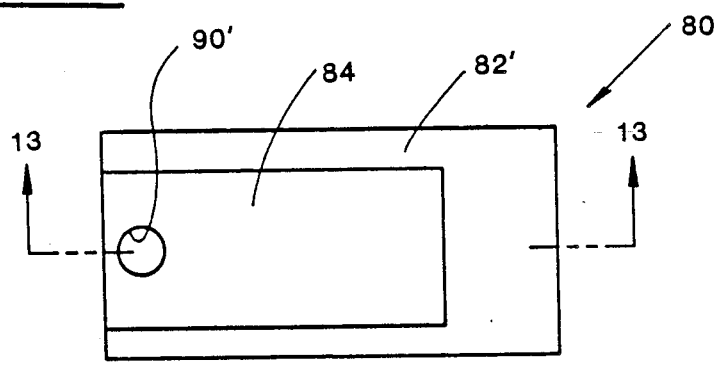
FIG. 12 is a plan view of the MLC of FIG. 11.
Figure 13:
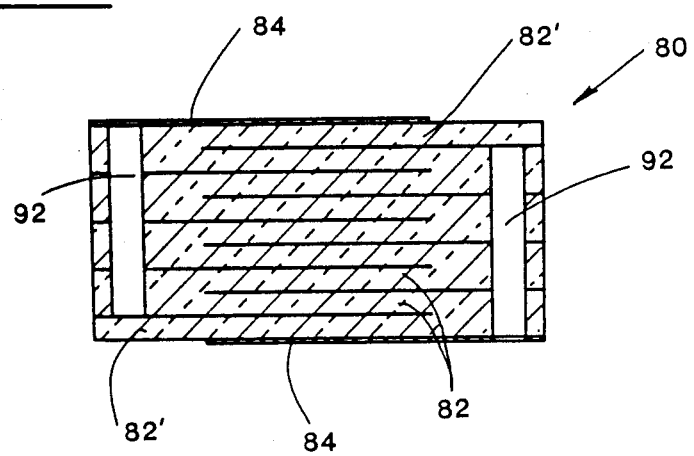
FIG. 13 is a cross-sectional elevation view along the line 13—13 of FIG. 12.

Referring jointly to FIGS. 11–13, a multilayer ceramic capacitor (MLC) is shown generally at 80. MLC 80 is comprised of a plurality of ceramic layers 82 and 82' having a conductive (metallic) electrode 84 printed thereon. Preferably, three sides 86, 86' and 86" of electrode 84 terminate inwardly of each planar ceramic layer 82 or 82' with the fourth side or end 88 co-terminating with the edge of ceramic layer 82. The inner ceramic layers 82 each have a pair of oppositely disposed openings 90 therethrough for a via connection. The two outer (top and bottom) layers 82' each have only one opening 90' with the opening in the top layer being oppositely disposed from the opening in the bottom layer. As shown in FIG. 13, assembled multilayer ceramic capacitor 80 is a series of stacked ceramic layers interleaved with conductive electrodes; with alternating electrodes being electrically connected by via interconnections 92. The top and bottom ceramic layers 82' each have exposed conductive electrodes 84.

In FIGS. 14 A–D, a second embodiment of a multilayer ceramic capacitor for use in the present invention is shown. Referring first to FIG. 14A, a multilayer ceramic capacitor 92 is assembled in a manner similar to the MLC of FIGS. 11–13. Thus, a plurality of layers of ceramic material 94 are interleaved with electrode layers 96; with alternating electrodes being electrically connected along either end 98 and 100. However, in contrast to the MLC of FIGS. 11–13, MLC 92 has upper and lower ceramic layers 94' which are substantially thicker than inner ceramic layers 94. The presence of thicker upper and lower layers is important in providing room for the removal of a portion of each layer as will be described hereinafter.

Figure 14A:
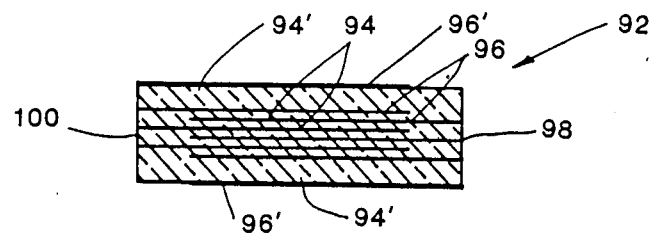
FIGS. 14A–14C are cross-sectional elevation views of a multilayer capacitor chip in accordance with a second embodiment of the present invention.
Figure 14B:
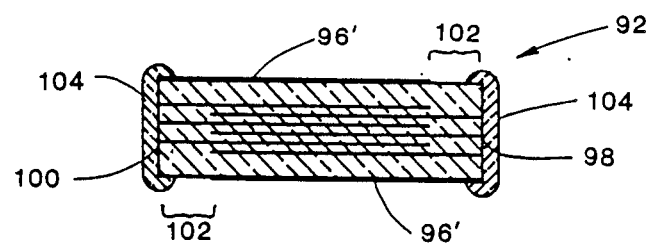

In an effort to avoid electrical shortening across the gap 102 defined between the top and bottom electrodes 96' and end electrodes 98 and 100, each end is provided with an insulating sheath 104 as shown in FIG. 14B. Sheath 104 may be comprised on any suitable electrically insulative material such as epoxy or glass.

Figure 14C:
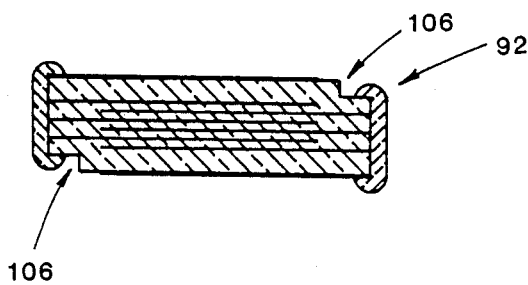
Figure 14D:
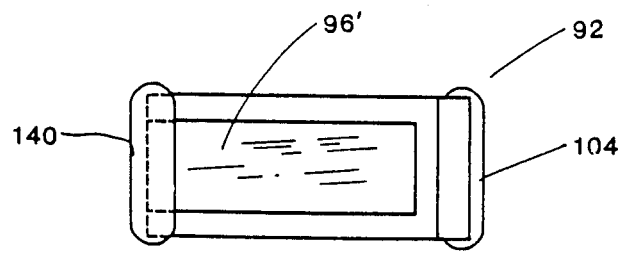

Referring to FIGS. 14C and 14D, a portion of the end termination is partially removed at opposed diagonal corners of MLC 92 as identified at 106. The partial removal of sections 106 may be accomplished with an appropriate abrasion method. The final MLC construction with the removed sections 106 further eliminates any risk of electrical bridging of gap 102 of FIG. 14B.

Figure 15:
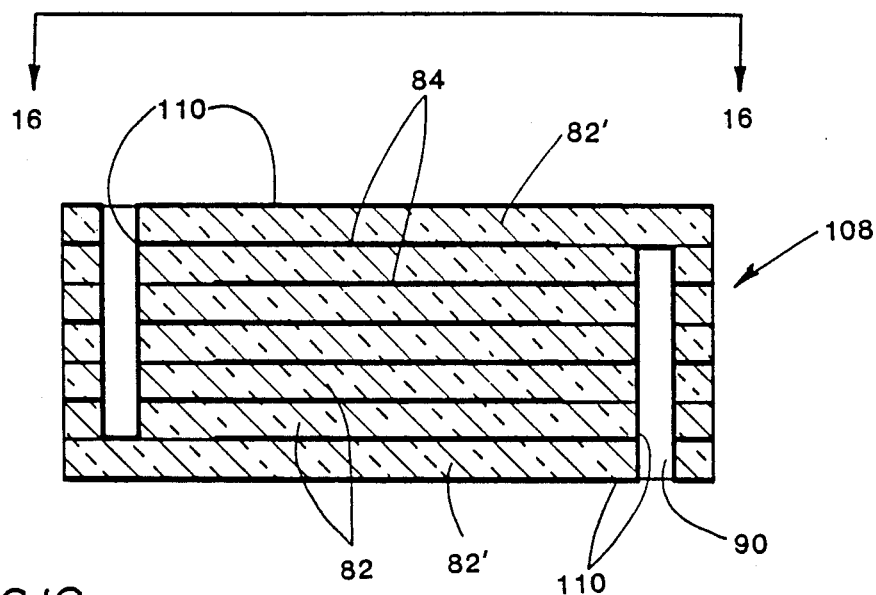
FIG. 15 is a cross-sectional elevation view of a multilayer capacitor chip in accordance with a third embodiment of the present invention.
Figure 16:
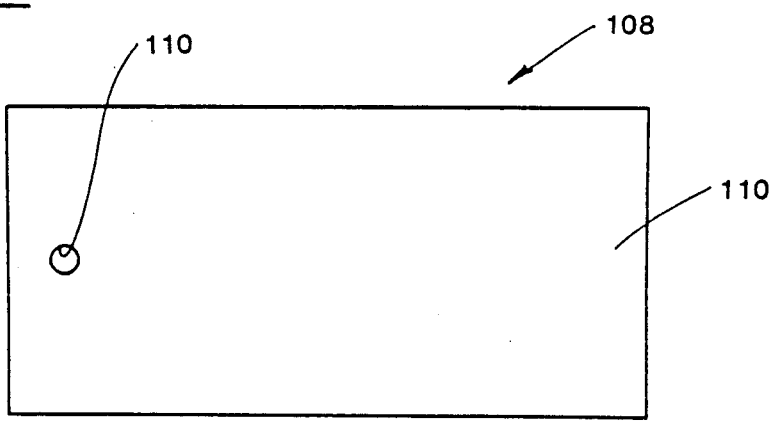
FIG. 16 is a plan view along the line 16—16 of FIG. 15.

In FIGS. 15 and 16, a MLC is shown generally at 108 and is similar to MLC 80 of FIGS. 11–13. Thus, MLC 108 is comprised of a plurality of ceramic layers 82 and 82' having a conductive (metallic) electrode 84 printed thereon. The inner ceramic layers each have a pair of oppositely disposed openings 90 therethrough for a via connections. The outer (top and bottom) layers 82' each have only one opening 90' with the opening in the top layer being oppositely disposed from the opening in the bottom layer. In contrast to MLC 80, MLC 108 includes an electroless nickel plating layer 110 on the top and bottom ceramic layers 82' and in holes 90. In a preferred method of making MLC 108, ceramic layers with electrodes printed thereon are stacked up, the organic binders are burned off and the stack up is sintered (fired). The stack up is then electroless nickel plated and finally individual chips (MLC's) are separated by diamond sawing or other suitable process.

All three configurations of multilayer capacitor chips shown in FIGS. 11–16 have in common a "parallel plate" construction which leads to low inductance. The significant advantages of such "parallel plate" type multilayer capacitor chips are discussed in greater detail in corresponding U.S. application Ser. No. 839,636 filed Mar. 14, 1986, assigned to the assignee hereof, all of the contents of which are incorporated herein by reference. It will be appreciated that while multilayer ceramic capacitor chips of the "parallel plate" type are preferred (particularly, the MLC identified at 80 in FIGS. 11–13), other multilayer capacitor chips may also be utilized in accordance with the decoupling capacitor for PGA packages of the present invention.

Figure 17:
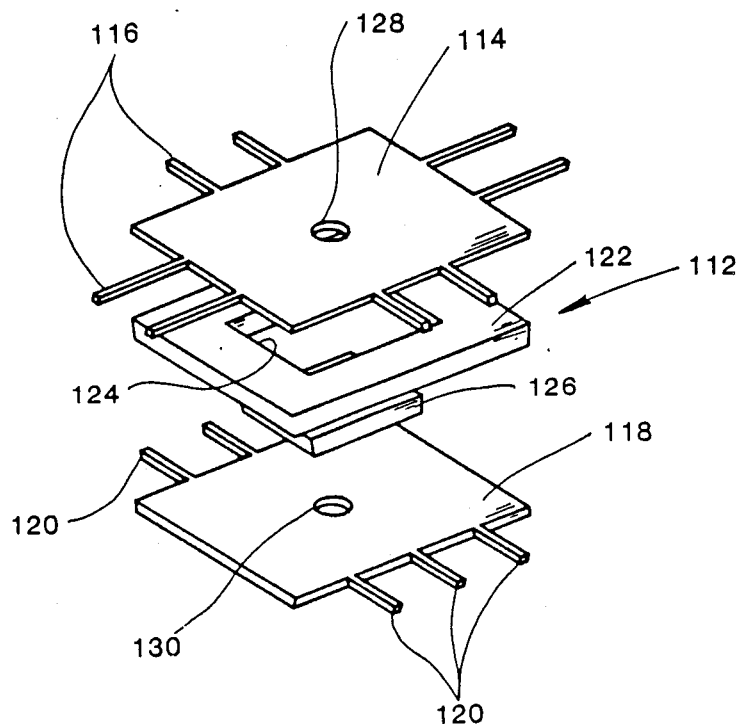
FIG. 17 is an exploded perspective view of a decoupling capacitor for a Pin Grid Array package incorporating a multilayer capacitor chip therein in accordance with the present invention.
Figure 18:
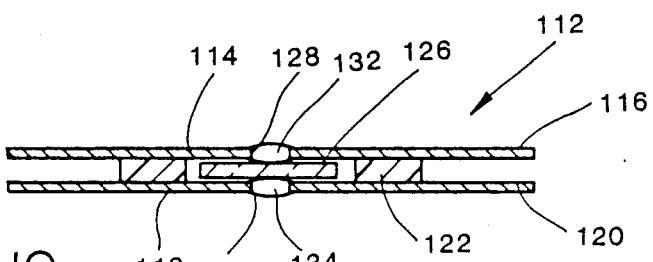
FIG. 18 is a cross-sectional elevation view of the decoupling capacitor of FIG. 17.
Figure 19:
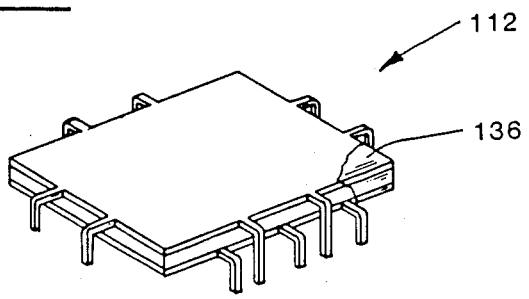
FIG. 19 is a perspective view of the decoupling capacitor of FIGS. 17 and 18.

Turning now to FIGS. 17–19, a decoupling capacitor for PGA packages is shown generally at 112 which incorporates a multilayer capacitor chip therein. Decoupling capacitor 122 comprises a first conductor 114 having a plurality of first leads 116 extending therefrom at preselected locations along the periphery thereof and a second conductor 118 having a plurality of second leads 120 extending therefrom at preselected locations along the periphery thereof. An annular insulating spacer 122 is positioned between conductors 114 and 118. Insulating spacer 112 has an opening 124 therethrough for receiving a multilayer capacitor chip 126 such as one of the MLC chips shown in FIGS. 11-17. Holes 128 and 130 are respectively provided in conductors 114 and 118. Subsequent to assembly of the conductors 114, 118, insulating spacer 122 and multilayer capacitor chip 126, solder or any other suitable electrically conductive adhesive means as identified at 132 and 134 (conductive epoxy) are delivered to holes 128 and 130 to effect an electrical and mechanical connection between conductors 114 and 118. Thereafter, decoupling capacitor 112 is environmentally sealed with an encapsulate material 136 using any suitable and well known method and leads 116 and 188 are bent downwardly for through hole insertion. Alternatively, leads 116 and 118 may be formed for surface mounting.

Figure 20:
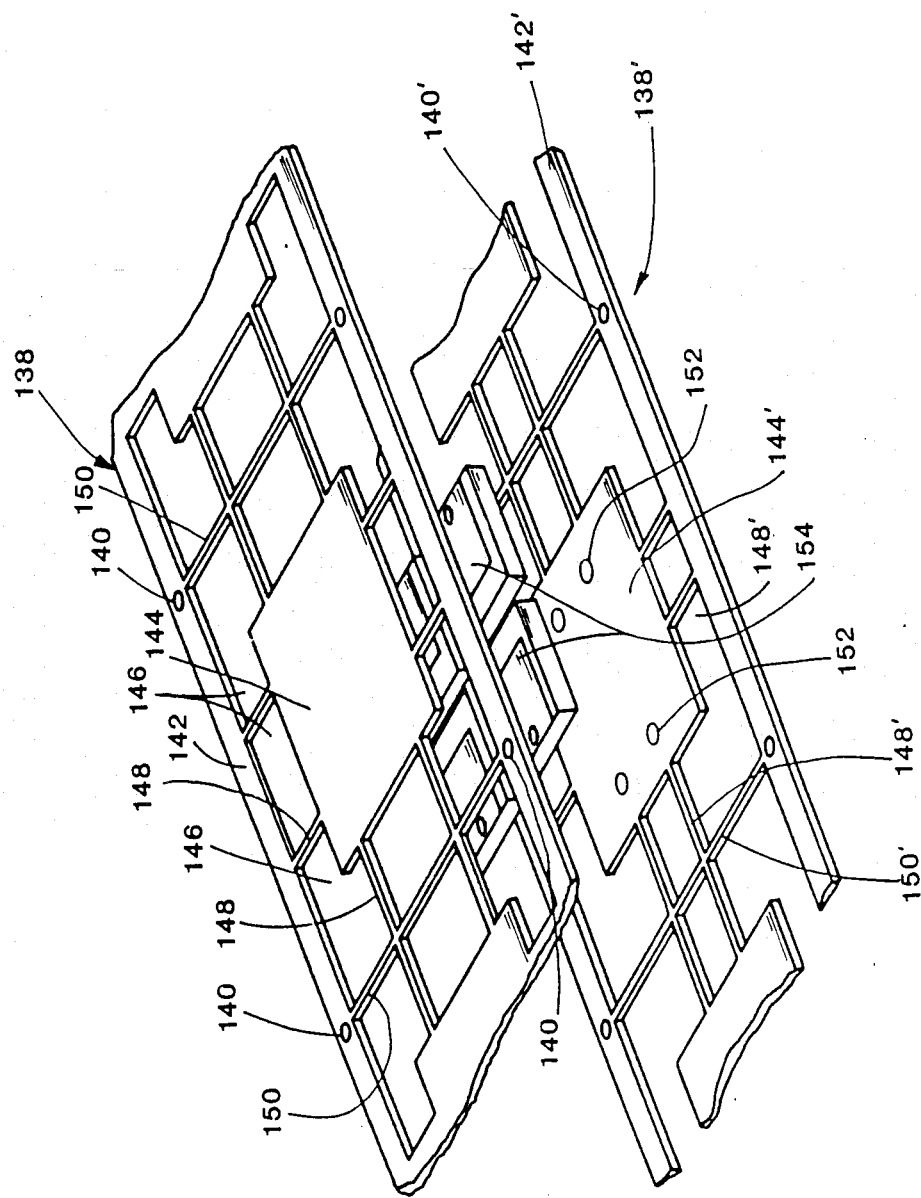
FIG. 20 is an exploded perspective view of another decoupling capacitor for a Pin Grid Array package incorporating a multilayer capacitor chip therein in accordance with the present invention.
Figure 21:
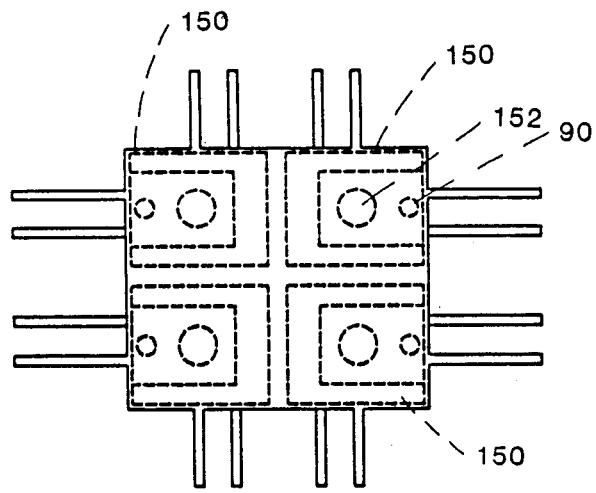
FIG. 21 is a plan view of the decoupling capacitor of FIG. 20.
Figure 22:
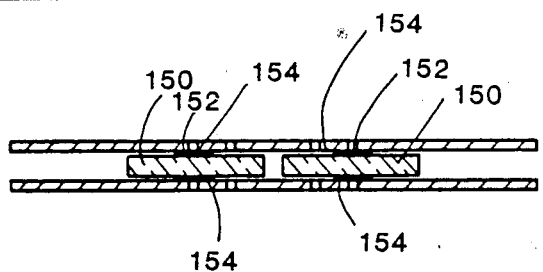
FIG. 22 is a cross-sectional elevation view of the decoupling capacitor of FIG. 20.

A preferred method of manufacturing PGA package decoupling capacitors incorporating multilayer chips is shown in FIGS. 20-23. Referring first to FIG. 20, a first or top lead frame used in accordance with the present invention is shown generally at 138. Top lead frame 138 is a continuous planar strip of conductive material i.e., copper, which is provided with openings 140 along opposed side edges or carrier strips 142 thereof for registration and transport. It will be appreciated that FIG. 20 shows only a small portion of a lead frame which is suitable for forming three decoupling capacitors in accordance with the present invention. It will further be appreciated that lead frame 138 is preferably a stamped part wherein all the components thereof are rigid. Thus, the desired lead frame configuration is formed by removing unwanted material from the strip of conductive material using any suitable and conventional technique.

Lead frame 138 includes a top conductor body portion 144 and is isolated from edge strips 142 by substantially rectangular openings 146. Conductor 144 includes a plurality of pins or leads 148 integrally attached thereto which are connected to either edge strips 142 or a lateral support member 150 running between edge strips 142.

Similarly, bottom lead frame 138' is a continuous planar strip of conductive material, i.e., copper, which is provided with openings 140' along opposed side edges or carrier strips 142' thereof for registration and transport. Bottom lead frame 138' also has a conductor 144' and includes a plurality of pins or leads 148' which are integrally attached thereto. It will be appreciated that conductors 144 and 144' are supported within lead frames 138 and 138', i.e., on edge portions 142 and 142' by leads 148 and 148' and lateral support members 150 and 150' respectively. Finally, lead frames 138, 138' may also include stand-off means 59, 59' (FIGS. 9A and 9B), i.e., dimples for spacing back the decoupling capacitor from the circuit board.

Referring jointly to FIGS. 20-23, lead frames 138 and 138' as described hereinabove sandwich therebetween at least one, and preferably more than one, multilayer capacitor chip. In the particular embodiment shown, four (4) multilayer ceramic capacitor chips 150 are sandwiched between conductors 144 and 144'.

Figure 23:
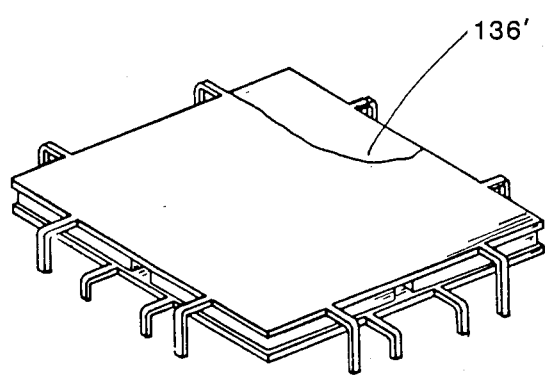
FIG. 23 is a perspective view of the decoupling capacitor of FIG. 20.

Prior to assembly, an array of drops 152 of solder paste or other suitable electrically conductive adhesive material (i.e., epoxy, polyimide, etc.) are placed between each conductor 144 and 144' and each exposed electrode 154 of MLC 150. The assembly is then passed through an oven (infrared) to reflow the solder paste (or cure the conductive adhesive). The assembly is then cleaned to remove the solder flux residues (if appropriate). The encapsulation of the assembly can be accomplished by a molding process (transfer or injection), by a fluidized bed coating process, by an electrostatic epoxy powder spray process, or any other suitable method which provides environmental protection for the assembly. Each individual PGA decoupling device is then cut out from the lead frames and its leads formed for through hole insertion or surface mounting as shown in FIG. 23.

Preferably, MLC 150 will be of the parallel plate type such as one of those MLC'S identified in FIGS. 11-16. Such an MLC is comprised of a ceramic body having interleaved layers of conductive electrodes with its outermost electrodes exposed to define top and bottom connecting surfaces. It will be appreciated that the actual number of interleaved layers of ceramic and metallization will depend upon the degree of desired capacitance.

The decoupling capacitor for PGA package incorporating multilayer capacitor chips retains all of the many important features and advantages discussed with regard to the single layer capacitor of FIGS. 1-10 such as an overall parallel plate construction for lower inductance. Moreover, the decoupling capacitor incorporating multilayer capacitors as disclosed in FIGS. 11-23 also provide further advantages not found in the single layer capacitors. For example, the decoupling capacitor of FIGS. 11-23 exhibit much higher capacitance values for greater noise reduction than is possible with single layer capacitor elements. Also, the temperature stability of the individual capacitor elements is increased by selection of temperature stable dielectric ceramic formulations in the multilayer chips.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A multilayer capacitive element comprising:
    interleaved layers of conductive material and dielectric material with alternating layers of conductive material being electrically connected and defining first and second groups of conductive layers, said first group having at least one exposed conductive layer defining a first exposed conductive layer and said second group having at least one exposed conductive layer defining a second exposed conductive layer, said first and second groups of conductive layers being mutually parallel to each other;
    said dielectric material including a pair of opposed end surfaces and top and bottom surfaces;
    said first group of conductive layers being spaced from one of said opposed end surfaces of said dielectric material and said second group of conductive layers being spaced from the other of said opposed end surfaces of said dielectric material;
    a first via through said dielectric material electrically interconnecting said first group of conductive layers and a second via through said dielectric material electrically interconnecting said second group of conductive layers;

said first via extending paratially into said dielectric material from said first exposed conductive layer; and said second via extending partially into said dielectric material from said second exposed conductive layer.

2. The capacitive element of claim 1 including:

an electroless plating layer over at least a portion of said top and bottom surface of said dielectric material and in said vias.

3. The capacitive element of claim 1 wherein:

said dielectric material is a ceramic material.

4. A multilayer capacitive element comprising:

interleaved layers of conductive material and dielectric material with alternating layers of conductive material being electrically connected and defining first and second groups of conductive layers, said first group having at least one exposed conductive layer defining a first exposed conductive layer and said second group having at least one exposed conductive layer defining a second exposed conductive layer, said first and second groups of conductive layers being mutually parallel to each other;

said dielectric material including a pair of opposed end surfaces and top and bottom surfaces, said top surface communicating with said end surfaces defining first and second edges and said bottom surface communicating with said end surfaces defining third and fourth edges, said first exposed conductive layer being disposed on said top surface and said second exposed conductive layer being disposed on said bottom surface;

a first conductive end termination on one of said opposed end surfaces of said dielectric material and a second conductive end termination on the other of said opposed end surfaces of said dielectric material;

said first group of alternating conductive layers terminating at said first conductive end termination and said second group of alternating conductive layers terminating at said second conductive end termination, said first exposed conductive layer being connected and substantially transverse to said first conductive end termination, said second exposed conductive layer being connected and substantially transverse to said second conductive end termination, a first gap being defined between said first exposed conductive layer and said second end termination and a second gap being defined between said second exposed conductive layer and said first end termination;

said first edge being disposed in said first gap and said third edge being disposed in said second gap; and a portion of dielectric material along the entire length of said first and third edges being removed.

5. The capacitive element of claim 4 including:

an electrically insulative cap being provided over each of said first and second conductive end terminations wherein said conductive end terminations are encapsulated and wherein electrical bridging in said gap between said first exposed conductive layer and said second conductive end termination and in said gap between said second exposed conductive layer and said first conductive end termination is precluded by said insulative caps.

6. The capacitive element of claim 5 wherein:

said insulative cap is comprised of a material selected from the group comprising glass and epoxy.

7. The capacitive element of claim 4 wherein:

said interleaved layers of dielectric material have a predetermined thickness; and wherein said layers of dielectric material adjacent said top and bottom surfaces have a larger thickness relative to the other layers of dielectric material.

8. The capacitive element of claim 4 wherein:

said dielectric material is a ceramic material.

9. A multilayer capacitive element comprising:

interleaved layers of conductive material and dielectric material with alternating layers of conductive material being electrically connected and defining first and second groups of conductive layers, said first group having at least one exposed conductive layer defining a first exposed conductive layer and said second group having at least one exposed conductive layer defining a second exposed conductive layer, said first and second groups of conductive layers being mutually parallel to each other;

said dielectric material including a pair of opposed end surfaces and top and bottom surfaces, said first exposed conductive layer being disposed on said top surface and said second exposed conductive layer being disposed on said bottom surface;

a first conductive end termination on one of said opposed end surfaces of said dielectric material and a second conductive end termination on the other of said opposed end surfaces of said dielectric material;

said first group of alternating conductive layers terminating at said first conductive end termination and said second group of alternating conductive layers terminating at said second conductive end termination, said first exposed conductive layer being connected and substantially transverse to said first conductive end termination, and said second exposed conductive layer being connected and substantially transverse to said second conductive end termination, a first gap being defined between said first exposed conductive layer and said second end termination and a second gap being defined between said second exposed conductive layer and said first end termination;

said interleaved layers of dielectric material having a predetermined thickness; and wherein said layers of dielectric material adjacent said top and bottom surfaces are both substantially equal in thickness and have a larger thickness relative to the other layers of dielectric material.

10. The capacitive element of claim 9 including:

an electrically insulative cap being provided over each of said first and second conductive end terminations wherein said conductive end terminations are encapsulated and wherein electrical bridging in said gap between said first exposed conductive layer and said second conductive end termination and in said gap between said second exposed conductive layer and said first conductive end termination is precluded by said insulative caps.

11. The capacitive element of claim 10 wherein:

said insulative cap is comprised of a material selected from the group comprising glass and epoxy.

12. The capacitive element of claim 9 wherein:

said dielectric material is a ceramic material.

13. A multilayer capacitive element comprising:

interleaved layers of conductive material and dielectric material with alternating layers of conductive material being electrically connected and defining first and second groups of conductive layers, said first group having at least one exposed conductive layer defining a first exposed conductive layer and said second group having at least one exposed conductive layer defining a second exposed conductive layer, said first and second groups of conductive layers being mutually parallel to each other;

said dielectric material including a pair of opposed end surfaces and top and bottom surfaces;

said first group of conductive layers being spaced from one of said opposed end surfaces of said dielectric material and said second group of conductive layers being spaced from the other of said opposed end surfaces of said dielectric material;

a first via through said dielectric material electrically interconnecting said first group of conductive layers and a second via through said dielectric material electrically interconnecting said second group of conductive layers; and an electroless plating layer over at least a portion of said top and bottom surface of said dielectric material and in said vias.

14. The capacitive element of claim 13 wherein:

said dielectric material is a ceramic material.

* * * * *